METHOD FOR MINIMIZING AUTODOPING IN EPITAXIAL DEPOSITION

Filed Sept. 29, 1970

INVENTORS
ANGELO V. BADAMI
EKKEHARD EBERT
BERNARD M. KEMLAGE
KARL E. KROELL
H. BERNHARD POGGE

BY Wolmar J. Stoffel
ATTORNEY 3,669,769

METHOD FOR MINIMIZING AUTODOPING IN EPITAXIAL DEPOSITION

Angelo V. Badami, Wappingers Falls, N.Y., Ekkehard Ebert, Sindelfingen, Germany, Bernard M. Kemlage, Hopewell Junction, N.Y., Karl E. Kroell, Stuttgart-Rohr, Germany, and H. Bernhard Pogge, La Grangeville, N.Y., assignors to International Business Machines Corporation, Armonk, N.Y.

Filed Sept. 29, 1970, Ser. No. 76,399

Int. Cl. H01l *7/36;* C23c *13/00*

U.S. Cl. 148—175 8 Claims

ABSTRACT OF THE DISCLOSURE

Autodoping is minimized during the growth of an epitaxial layer on a semiconductor substrate by using a gaseous reaction mixture that deposits the initial capping layer at a relatively slow deposition rate. The reaction mixture contains a relatively minor portion of a semiconductor compound along with the carrier gas. Subsequently, a second gaseous reaction mixture containing a greater portion of a compound of a semiconductor material is used to complete the deposition of the epitaxial layer. This is done merely to reduce the total growth cycle.

BACKGROUND OF THE INVENTION

Field of the invention

The present invention relates to the growth of epitaxial layers on semiconductor substrates and more particularly to a method for achieving a control over the impurity concentration level in the epitaxial layer or other deposited layer.

Description of the prior art

The term "epitaxy," known to those skilled in the art, implies a continuation of the lattice structure of a crystalline substrate into a deposited material. In the semiconductor industry a layer of semiconductor material is conventionally deposited on a monocrystalline semiconductor wafer wherein the crystal lattice of the layer is a continuation of the base wafer. The active regions of the devices are generally fabricated into the epitaxial layer and the base wafer serves normally as a support.

In fabricating integrated circuit devices, it is conventional to diffuse impurities into the base wafer to form subcollector regions in order to fabricate transistors into the epitaxial layer. It has been noted that during the initial phases of the epitaxial deposition cycle impurities are outdiffused from these regions and are spread laterally over the surface of the wafer. These impurities become incorporated into the epitaxial layer during growth. In cretain types of devices wherein the base wafer and the epitaxial layer is doped with the same type of impurity, the opposite type of impurity outdiffusing from the diffused region may be present to a degree sufficient to change the doping of the interface region away from the diffused area. In other devices where the diffused region and the epitaxial layer is of opposite type than the base wafer, variation in resistivities occur in the epitaxial film with lower resistivities occurring nearest the interface region. This may have detrimental effects on particular device performances. As semiconductor technology developed, devices became increasingly miniaturized and active as well as passive devices embodied therein were positioned more closely together. The problems presented by the autodoping phenomena, therefore, became more serious. This is particularly true in applications utilizing a self-isolation scheme, as set forth in commonly assigned patent application Ser. No. 875,012, filed Nov. 10, 1969, which discloses a process wherein devices are formed in regions that are produced by outdiffusing a heavily doped region in the base wafer upwardly into the epitaxial layer. In such instances, the wafer base and overlying epitaxial layer are doped with a similar type impurity. Autodoping produces thin expanded impurity regions at the interface of the wafer and epitaxial layer which may overlap when the devices are closely spaced and thereby causing objectionable internal shorting. Autodoping also causes problems by altering the impurity profiles in the epitaxial layer. A specific example is in the forming of a resistor in such an epitaxial layer. A non-uniform doping of that layer causes higher conductivity within the resistors which complicates process control.

Two main types of vapor epitaxial growth processes are known, e.g., disproportionation processes and pyrolytic decomposition processes.

Basically, in the vapor epitaxial growth using a disproportionation reaction, a material which is a semiconductor constituent is formed into a compound with a carrier element or material at one temperature in the deposition system, and is released or disproportionated from the carrier material at another temperature at the substrate, which is typically monocrystalline.

In pyrolytic decomposition processes, a compound of which the semiconductor is one constituent is decomposed by heat in the vicinity of the substrate and the semiconductor compound constituent of the lattice grows on the substrate.

Epitaxial growth of both depositions typically takes place at elevated temperatures. For example, the epitaxial deposition of silicon on a silicon substrate occurs normally in the temperature range of 900–1200° C.

In the fabrication of an integrated circuit device it is convenient to deposit an epitaxial layer or film on a semiconductor substrate over diffused regions in the substrate. At the temperature at which epitaxial growth occurs, the impurity in a diffused region has a sufficient vapor pressure to outdiffuse from the diffused region.

Due to aerodynamical conditions, the main gas flow within the reactor creates a thin layer of relatively static gas in the immediate vicinity of the substrate surface. Some of the outdiffusing impurity atoms will have sufficient energy to enter the main gas flow, although most of the impurity atoms from the diffused region lack sufficient energy to penetrate this thin boundary layer. As a result, these atoms are laterally distributed within the generally static gas layer since there are no thermal or aerodynamical restrictions for lateral motion of the atoms within this layer; this results in the possibility of impurity atoms being redeposited onto the surface of the substrate, not only over the diffused region but also in the non-diffused or substrate regions. This lateral transport of the impurity atmos is due to the tendency to establish an equilibrium of the impurity concentration within the gas phase of the boundary layer, causing the epitaxial film or other deposited layer to be autodoped at substantial distances from the diffused region in the substrate. Of course, the impurity concentration decreases away from the diffused region but it is still significant at substantial distances from the diffused region.

The present invention provides a method for growing an epitaxial layer so that it does not have an uncontrolled impurity concentration due to autodoping. The invention controls or significantly reduces autodoping from the diffused region of a substrate by capping the diffused region with an initial growth so that the impurity atoms in the diffused region cannot escape from the diffused region into the portions of the epitaxial layer or into the non-diffused regions of the substrate.

The object of this invention is to provide a method of controlling autodoping.

Another object of this invention is to provide a method for minimizing autodoping by means of controlled variations in the compositions of the gaseous reaction mixture used to produce the epitaxial layer wherein a "cap" is formed under conditions which minimize the incorporation of the outdiffused impurity within the deposited layer.

SUMMARY OF THE INVENTION

Autodoping during epitaxial deposition of a semiconductor on a base wafer having a diffused region therein is minimized by making the initial epitaxial deposit at a relatively slow growth rate. This slow rate is achieved by providing a gaseous reaction mixture containing a relatively low portion of the compound of a semiconductor material used to form the deposit on the heated substrate. After the capping layer has been deposited, the remaining layer can be deposited at a relatively higher rate by increasing the concentration of the compound of the semiconductor material in the gaseous reaction mixture. The increase in growth rate is desirable, but not necessary, to reduce the overall high temperature process cycle.

BRIEF DESCRIPTION OF THE DRAWINGS

The foregoing and other objects, features, and advantages of the invention will be more apparent from the following more particular description of the preferred embodiments of the invention as illustrated in the accompanying drawings.

In the drawings.

DETAILED DESCRIPTION OF THE PREFERRED EMBODIMENTS

Figure 4:
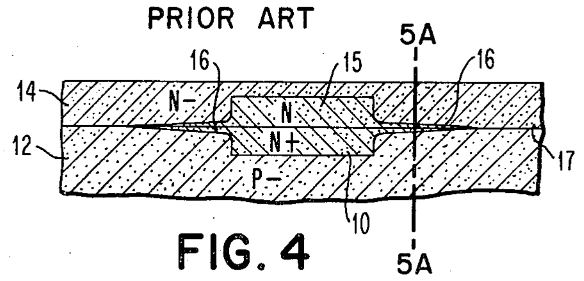
FIG. 4 is an elevational view in cross-section of a semiconductor device illustrating the profiles produced by autodoping during the deposition of an N-type epitaxial layer on a P-type substrate with a localized N+ diffusion by known prior art techniques.
Figure 5:
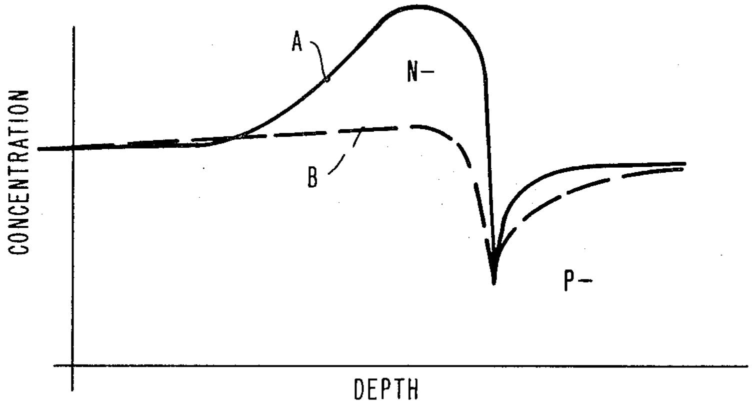
FIG. 5 is a graph of impurity concentration versus depth illustrating the impurity profiles resulting from uncontrolled N-type autodoping of an intrinsic deposition and comparing the same with the profile produced by the process of the invention.

Referring now to the drawings, FIG. 4 illustrates the configuration of an outdiffused impurity region in the N-type epitaxial layer being deposited by conventional prior art techniques. As illustrated, diffused region 10 of opposite type than base wafer 12 produces in the epitaxial layer 14 a region 15 having long, thin laterally extending regions 16 about the region 10 located at the interface 17 between wafer 12 and layer 14. Region 16 can in certain types of devices cause shorts between active elements and also alter the characteristics of resistors when integrated circuit devices are fabricated in layer 14. In FIG. 5, curve A, depicts the profile taken on line 5A which indicates a relatively heavy impurity concentration adjacent to the interface.

Figure 1:
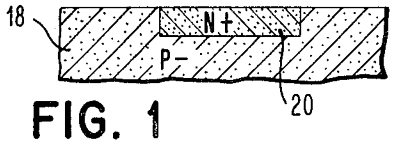
FIG. 1–3 is a sequence of elevational views in broken cross-section of a semiconductor wafer illustrating the structure during various stages of the process.
Figure 2:
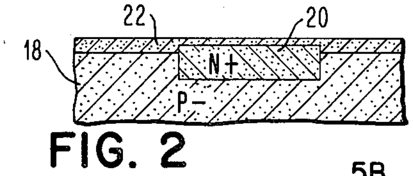
Figure 3:
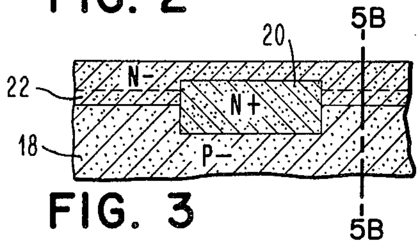

FIG. 1 depicts a monocrystalline wafer 18 doped with a P-type impurity with a diffused region 20 having a relatively high concentration on N-type impurity. A thin initial epitaxial layer 22 is grown on base wafer 18 by positioning the wafer in an epitaxial reactor, heating the wafer up to a growth temperature on the order of 900–1300° C. and introducing a gaseous reaction mixture capable of depositing semiconductor material. The gaseous mixture contains a compound of the semiconductor material and a carrier gas. Upon coming in contact with the heated wafer, the semiconductor material will deposit on the wafer forming a continuation of the original crystal lattice of the wafer. In order to minimize the autodoping effect during the deposition of layer 22 the concentration of the compound of the semiconductor material in the gaseous mixture is maintained at a relatively low value typically 0.01 to 0.1 percent by volume. Preferably this ratio of the carrier gas to the compound of the semiconductor material is in the range of 1000 to 10,000. The resultant relatively slow growth rate is achieved by utilizing the above mentioned reactive mixture which substantially reduces lateral autodoping. The deposition rate is in the range of 10 to 5000 A. per minute, more preferably 100 to 800 A. per minute. The compound of the semiconductor material can be $SiH_4$, $SiCl_4$, $SiHCl_3$, $GeH_4$, $GeI_4$, or other semiconductor source material such as III–V or II–VI compounds. The carrier gas is typically hydrogen but could also be another inert gas such as nitrogen, argon or the like, or mixtures of gases. During the deposition of a silicon layer, the wafer is supported on a susceptor which can be heated by induction or other means to a temperature in the range of 800 to 1300° C. more preferably 1000 to 1200° C. After the desirable thickness has been achieved in layer 22, preferably from 2000 to 5000 A., the gaseous reaction mixture is changed to increase the proportion of the compound of the semiconductor material to between 1 to 4 percent. Preferably the ratio of the carrier gas to the compound of the semiconductor material is in the range of 25 to 100 volumes of carrier gas to one volume of semiconductor material. This mixture results in a significantly faster deposition rate, typically in the range of 1000 to 10,000 A. per minute. The deposition is continued until the desired thickness of the overall epitaxial layer is achieved which is typically from 1.0 to 20.0 microns. Curve B in FIG. 5 depicts the impurity concentration profile taken on line 5B of FIG. 3. Comparing profile B to A, it is obvious that the abnormally high autodoping about the impurity region 20 near the interface 17 is reduced.

Figure 6:
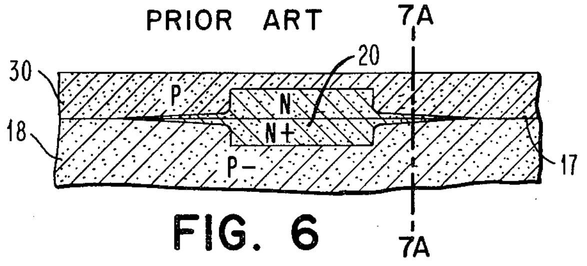
FIG. 6 is an elevational cross-sectional view of a semiconductor device having a P-type epitaxial layer deposited on a P-type substrate which contains a N+ localized diffused area.
Figure 7:
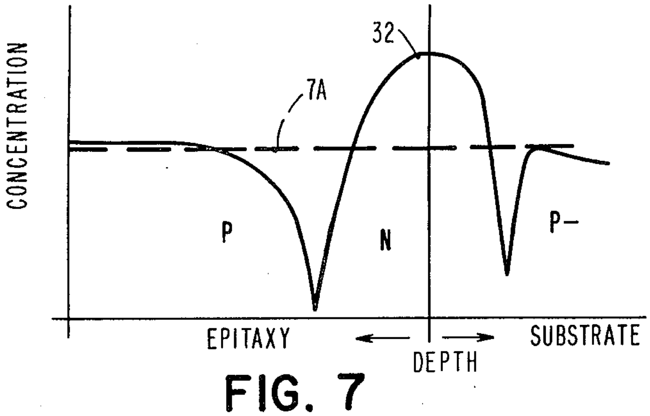
FIG. 7 is a graph of impurity concentration versus depth illustrating for comparison profiles produced by the subject method and prior art methods of depositing epitaxial layers.

FIG. 6 illustrates a P-type epitaxial layer 30 deposited on P-type wafer 18 provided with an N+ region 20. Curve 7A depicts the profile taken adjacent region 20 on section 7A when layer 30 is deposited by the method of this invention. In contrast curve 32 indicates the profile taken at the same point that could be reasonably expected if prior art deposition techniques are used to deposit layer 30. Note that a significant impurity concentration is present at the interface 17 when the standard technique is used.

The following examples are included to depict preferred specific embodiments of the method and should not be construed to unduly limit same.

EXAMPLE I

A silicon wafer having a diffused region with an arsenic impurity surface concentration of $2\times10^{20}$ was placed in a standard horizontal open tube reactor on an R.F. inductively heated susceptor. The reactor, maintained at room temperature, was then purged for ten minutes with argon flowing through the tube at 10 liters per minute. The reactor still at room temperature was then purged with hydrogen for ten minutes at a flow rate of 20 liters per minute. The wafer was then baked for ten minutes at 1175° C. in the hydrogen environment. A first gaseous reaction mixture for depositing the initial epitaxial layer was admitted to the reactor, which mixture was produced by introducing 20 liters of hydrogen per minute and 3 cc. of $SiCl_4$ per minute. The deposition rate was on the order of .01 micron per minute. After 7 minutes and 15 seconds the composition of the gaseous reaction mixture was changed by increasing the flow rate of the $SiCl_4$ to 230 cc. per minute. The deposition was continued for 7 minutes at a rate on the order of .5 micron per minute. Upon cooling, the wafer was examined and the epitaxial thickness measured. A resistivity profile was made 3.5 mils from the diffused region, which indicated that there was no significant autodoping at that point in the epitaxial layer.

EXAMPLE II

The effect of deposition rate on autodoping was demonstrated by depositing epitaxial layers on separate wafers, similar to the wafer described in Example I, at different rates. A first wafer was placed in the previously described reactor and the same initial purging and baking operation performed. An $H_2$-$SiCl_4$ gaseous mixture with a somewhat higher $SiCl_4$ concentration than the one described in Example I, was passed for 18 minutes over the wafer heated to a temperature of 1175° C. Thereafter the wafer was cooled, the thickness of the deposited layer measured by bevel and stain techniques and the impurity profile taken at a distance of 50 mils from the diffused region. The identical procedure was followed in depositing a layer on the second wafer except that the gaseous mixture was similar to the subsequent mixture described in Example I. The mixture was passed over the wafer for 7½ minutes. Thickness measurements indicated an epitaxial thickness of 3.3 microns on each wafer. The deposition rate for the first wafer was calculated as 0.18 micron per minute. The growth rate for the second wafer was 0.44 micron per minute. A comparison of the impurity profiles indicated that the outdiffused impurity on the second wafer at a point 50 mils from the edge of the diffused region was at least double that of the first wafer when also measured 50 mils away from the edge of the diffused region. This clearly indicated the beneficial effect of a reduced growth rate in regard to minimizing autodoping.

EXAMPLE III

The same apparatus, and techniques described in Example II are used to demonstrate the effect of deposition rate on autodoping when using $SiH_4$. The first wafer is exposed for 18 minutes to a gaseous mixture produced by admitting to the reactor 20 liters of hydrogen per minute and 50 cc. of $SiH_4$ per minute which will result in a growth rate of about 0.2 micron per minute. The second wafer is exposed for 7½ minutes to a gaseous mixture produced by admitting 20 liters of hydrogen per minute and 120 cc. of $SiH_4$ per minute to the reactor which will result in a growth rate of about 0.5 micron per minute. The wafers are heated to 1175° C. The deposition rate of silicon on the first wafer using the aforedescribed gaseous mixture is approximately ⅖ that of the rate resulting on the second wafer from using the second gaseous mixture. Significantly more autodoping results on the second wafer where the deposition occurs at a more rapid rate.

While the invention has been particularly shown and described with reference to preferred embodiments, it will be understood by those skilled in the art that the foregoing and other changes in the form and details may be made therein without departing from the spirit and scope of the invention.

What is claimed is:

1. A process for minimizing autodoping during deposition of an epitaxial layer of semiconductor material from the gaseous phase on a heated base of monocrystalline semiconductor material which base includes diffused regions of a semiconductor impurity, comprising:

contacting the base with a first gaseous reaction mixture which includes a carrier gas and a compound of the semiconductor material in a ratio in the range of 1000 to 10,000 volumes of carrier gas to one volume of the compound of the semiconductor material for a period of time sufficient to deposit an epitaxial layer having a thickness of at least 2,000 A.

said gaseous mixture resulting in a relatively slow deposition rate of from 0.001 to 0.5 microns per minute and subsequently, contacting the base with a second gaseous reaction mixture which includes a carrier gas and a compound of the semiconductor material in a range of 25 to 100 volumes of carrier gas semiconductor to one volume of the compound of the semiconductor material for a period of time sufficient to deposit the desired thickness of epitaxial layer, said second gaseous mixture resulting in a significantly faster deposition rate of from 0.1 to 1 micron per minute.

2. The process of claim 1 wherein said compound of a semiconductor material is a material selected from the group consisting of $SiH_4$, $SiCl_4$, $SiHCl_3$, $GeH_4$, and $GeI_4$.

3. The process of claim 2 wherein said carrier gas is $H_2$.

4. The process of claim 2 wherein said compound of semiconductor material is $SiCl_4$.

5. The process of claim 4 wherein said base is heated to a temperature in the range of 800 to 1300° C.

6. The process of claim 5 wherein said carrier gas is $H_2$.

7. The process of claim 6 wherein said first gaseous mixture yields a growth rate in the range of 0.01 to 0.08 micron per minute.

8. The process of claim 1 wherein said base is contacted by said first gaseous mixture for a time sufficient to deposit an epitaxial layer having a thickness in the range of 2000 to 5000 A.

References Cited

UNITED STATES PATENTS

| | | | |
|---|---|---|---|
| 3,177,100 | 4/1965 | Mayer et al. | 148—175 |
| 3,189,494 | 6/1965 | Short | 148—175 |
| 3,345,222 | 10/1967 | Nomura et al. | 148—175 |
| 3,473,978 | 10/1969 | Jackson, Jr. et al. | 148—175 |
| 3,511,702 | 5/1970 | Jackson, Jr. et al. | 148—175 X |
| 3,523,046 | 7/1970 | Grochowski | 148—175 |
| 3,523,838 | 8/1970 | Heidenreich | 148—175 |
| 3,558,374 | 1/1971 | Boss et al. | 148—175 X |

FOREIGN PATENTS

| | | | |
|---|---|---|---|
| 986,403 | 3/1965 | Great Britain | 148—175 |

OTHER REFERENCES

Thomas et al.: "Journal of the Electrochemical Society," No. 11 (November 1962), pp. 1055–61.

Gupta et al.: "Journal of the Electrochemical Society," No. 11 (November 1969), pp. 1561–65.

TOBIAS E. LEVOW, Primary Examiner

J. COOPER, Assistant Examiner

U.S. Cl. X.R.

117—106, 107.2